United States Patent
Akita et al.

(10) Patent No.: US 7,332,798 B2
(45) Date of Patent: Feb. 19, 2008

(54) NON-CONTACT ID CARD AND MANUFACTURING METHOD THEREOF

(75) Inventors: Masanori Akita, Otsu (JP); Yoshiki Sawaki, Otsu (JP)

(73) Assignee: Toray Engineering Company, Limited (JP)

( * ) Notice: Subject to any disclaimer, the term of this patent is extended or adjusted under 35 U.S.C. 154(b) by 159 days.

(21) Appl. No.: 10/553,460

(22) PCT Filed: Nov. 9, 2004

(86) PCT No.: PCT/JP2004/016564

§ 371 (c)(1),
(2), (4) Date: Oct. 17, 2005

(87) PCT Pub. No.: WO2005/045919

PCT Pub. Date: May 19, 2005

(65) Prior Publication Data

US 2006/0279941 A1    Dec. 14, 2006

(30) Foreign Application Priority Data

Nov. 11, 2003    (JP) .............................. 2003-380645

(51) Int. Cl.
*H01L 23/02* (2006.01)
*G06K 5/00* (2006.01)

(52) U.S. Cl. .............................. 257/679; 257/E23.064; 257/E23.176; 325/380; 325/488

(58) Field of Classification Search ................. 257/679, 257/922, E23.064, E23.176

See application file for complete search history.

(56) References Cited

U.S. PATENT DOCUMENTS 7,131,594 B2 * 11/2006 Ohta et al. .................. 235/492

FOREIGN PATENT DOCUMENTS

| JP | 63-283144 A | 11/1988 |
| JP | 02-101753 A | 4/1990 |
| JP | 05-013419 A | 1/1993 |
| JP | 06-283537 A | 10/1994 |
| JP | 10-313161 A | 11/1998 |
| JP | 2001-062517 A | 3/2001 |
| JP | 2001-217281 A | 8/2001 |

OTHER PUBLICATIONS

International Search Report (mailed on Feb. 8, 2005).

* cited by examiner

*Primary Examiner*—Long K. Tran
(74) *Attorney, Agent, or Firm*—Rader Fishman & Grauer PLLC

(57) ABSTRACT

Provided is a non-contact ID card which is superior in the productivity and the electrical properties, and a method capable of manufacturing such non-contact ID card. The non-contact ID card of the present invention is characterized in that the non-contact ID card comprises an antenna circuit board in which an antenna is formed on a substrate and an interposer board in which an enlarged electrode, which is connected to an electrode of an IC chip, is formed on a substrate on which the IC chip is mounted. The non-contact ID card is formed by laminating both boards in such a manner that the electrode of the antenna and the enlarged electrode are bonded, in which both electrodes are adhesively bonded by an insulating adhesive filled in minute recesses dispersed on bonding faces of the electrode of the antenna and/or the enlarged electrode.

7 Claims, 8 Drawing Sheets

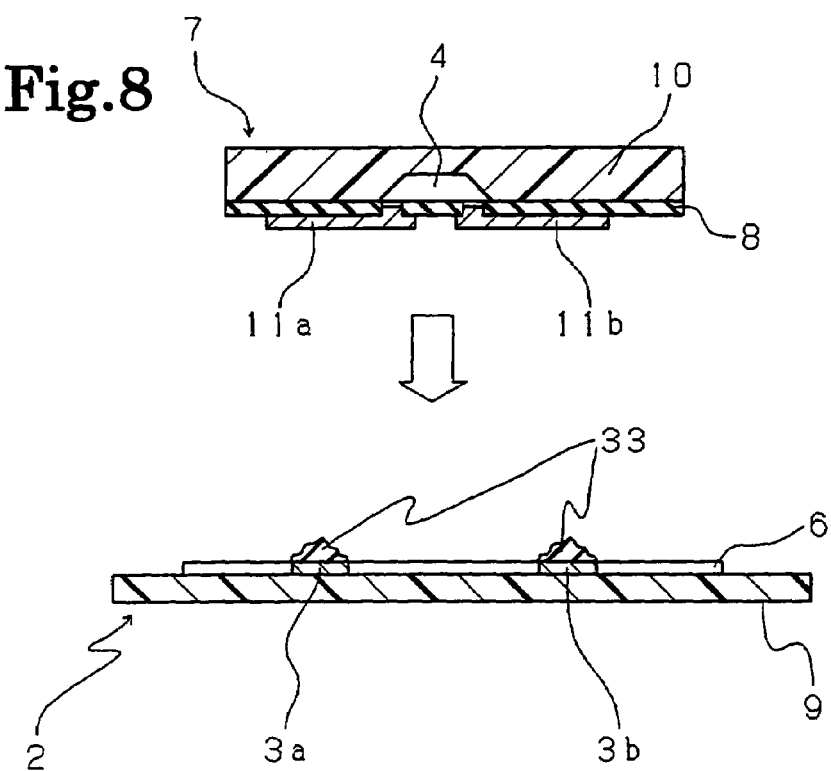
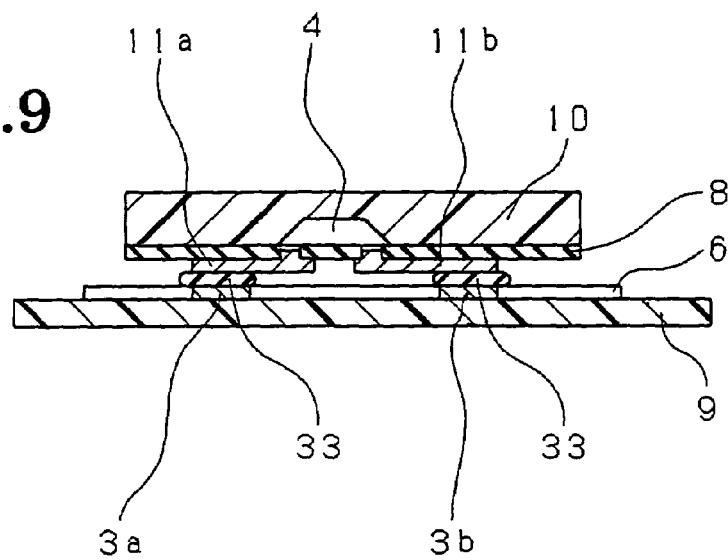

NON-CONTACT ID CARD AND MANUFACTURING METHOD THEREOF

TECHNICAL FIELD

The present invention relates to a non-contact ID (identification information) card, etc. and to a manufacturing method of the same.

BACKGROUND ART

Conventionally, there are various types of so-called non-contact ID cards, non-contact tags, and the like (referred to as non-contact ID cards hereinafter) wherein an IC chip is mounted on an antenna circuit board.

An example may be that of a non-contact ID card, comprised of an antenna circuit board in which the antenna is formed on a substrate, and an interposer board in which an enlarged electrode connected to an electrode of an IC chip is formed on a substrate on which the IC chip is mounted. Both boards are then laminated in such a way that the electrode of the antenna and the enlarged electrode conduct electricity (for an example, refer Patent Document 1). In this non-contact ID card, the electrode of the antenna and the enlarged electrode conduct electricity by bonding (referred to as adhesive bonding hereinafter) through conductive adhesive or conductive pressure-sensitive adhesive, or the electrode of the antenna and the enlarged electrode conduct electricity by being in close contact without any adhesive (referred to as a non-adhesive bonding).

However, in the above-mentioned adhesive bonding, paste or film-tape conductive adhesive or conductive pressure-sensitive adhesive needs to be applied or stuck to one of the micro electrodes, which is complicated and difficult to perform within a short time frame. In addition, the bond is prone to being displaced. Therefore, improvements are necessary for productivity, the electrical properties, and such like. The above-mentioned non-adhesive bonding bonds both substrates without using any conductive adhesive or conductive pressure-sensitive adhesive, and maintains both electrodes in close contact thereby. Hence, productivity is better when compared to the above-mentioned adhesive bonding. However, the electrical properties are inferior as conductivity between both electrodes is unstable.

There have been some methods experimented with where the electrode of the antenna and the enlarged electrode are adhesively bonded together and at the same time both substrates are bonded together, and where both electrodes are not regular metal electrodes but at least one is made of resin which is formed by the conductive adhesive. However, the aforementioned shortcomings have not yet been sufficiently overcome.

Patent Document 1: International Publication WO 01/62517 pamphlet

DISCLOSURE OF THE INVENTION

This invention has been designed to overcome the aforementioned problems, with the objective being to provide a non-contact ID card superior in regard to productivity and electrical properties, and a manufacturing method that can produce such a non-contact ID card.

In order to achieve the aforementioned objective, the non-contact ID card according to the present invention is comprised of an antenna circuit board in which the antenna is formed on a substrate, and an interposer board that has an enlarged electrode, which is connected to an electrode on an IC chip, formed on a substrate on which the IC chip is mounted. The non-contact ID card is formed by laminating both boards in such a manner that the electrode of the antenna and the enlarged electrode are bonded together, wherein both electrodes are adhesively bonded by an insulating adhesive filled in minute recesses dispersed on the bonding faces of the electrode of the antenna and/or the enlarged electrode so that the conductivity between the electrodes are retained.

Furthermore, in the manufacturing method of the non-contact ID card according to the present invention, before an antenna circuit board having an antenna formed on the substrate and an interposer board having an enlarged electrode, which is connected to an electrode of an IC chip, formed on a substrate that is mounted with the IC chip are laminated so that the positions of the electrode of the antenna and the enlarged electrode align, insulating adhesive is applied to at least either the electrode of the antenna or the enlarged electrode so as to fill insulating adhesive into minute recesses dispersed on the electrode bonding faces. Then after lamination, pressure is applied to make both electrodes come in close contact with each other, and thereby both electrodes are adhesively bonded together by the insulating adhesive filled the minute recesses so that the conductivity between the electrodes are retained.

Alternatively, in the manufacturing method of the non-contact ID card according to the present invention, before an antenna circuit board having an antenna formed on a substrate and an interposer board having an enlarged electrode, which is connected to an electrode of an IC chip, formed on a substrate that is mounted with the IC chip are laminated so that the positions of the electrode of the antenna and the enlarged electrode align, insulating adhesive is applied to at least either the electrode of the antenna or the enlarged electrode. After lamination, pressure and heat are applied to make both electrodes come in close contact with each other, and thereby the insulating adhesive is filled into the minute recesses dispersed on at least one bonding face of both electrodes, any remaining insulating adhesive is squeezed from the close contact areas of the electrodes to the periphery of the electrodes, and both electrodes are adhesively bonded to each other by the insulating adhesive filled in the minute recesses so that the conductivity between the electrodes are retained.

As described above, both electrodes are adhesively bonded together with insulating adhesive filled in the minute recesses dispersed on the bonding faces of the electrode of the antenna and/or the enlarged electrode. Thus, both electrodes can be securely bonded together in a conductive state.

In the present invention, the insulating adhesive is filled in the minute recesses dispersed on the bonding faces of the electrode of the antenna and/or the enlarged electrode, and both electrodes are adhesively bonded together with the filled insulating adhesive. Thus, even when the insulating adhesive is used, both electrodes can conduct electricity through the portions of the bonding faces of both electrodes where the minute recesses are not formed but maintain close contact. In the meantime, the areas of the bonding faces of both electrodes where the minute recesses are formed can be securely bonded together by the insulating adhesive as described above. Therefore, it is possible to provide a non-contact ID card that is superior in regard to productivity and electrical properties, and a method that can manufacture such non-contact ID cards.

BRIEF DESCRIPTION OF THE DRAWINGS

[FIG. 8] A longitudinal sectional view for showing the positional relation between the antenna circuit board and the interposer board of FIG. 6 at the time of starting the bonding.

[FIG. 9] A longitudinal sectional view for showing the state where the enlarged electrode of the interposer board of FIG. 6 is brought in contact with an insulating adhesive applied to the electrode (antenna electrode) of the antenna circuit board.

BEST MODE FOR CARRYING OUT THE INVENTION

The non-contact ID card according to the present invention is constructed by laminating an antenna circuit board and an interposer board. One of the examples is illustrated in a plan view of FIG. 1 and in FIG. 2 that is a perspective cross section taken along the line X-X of FIG. 1.

Figure 3:
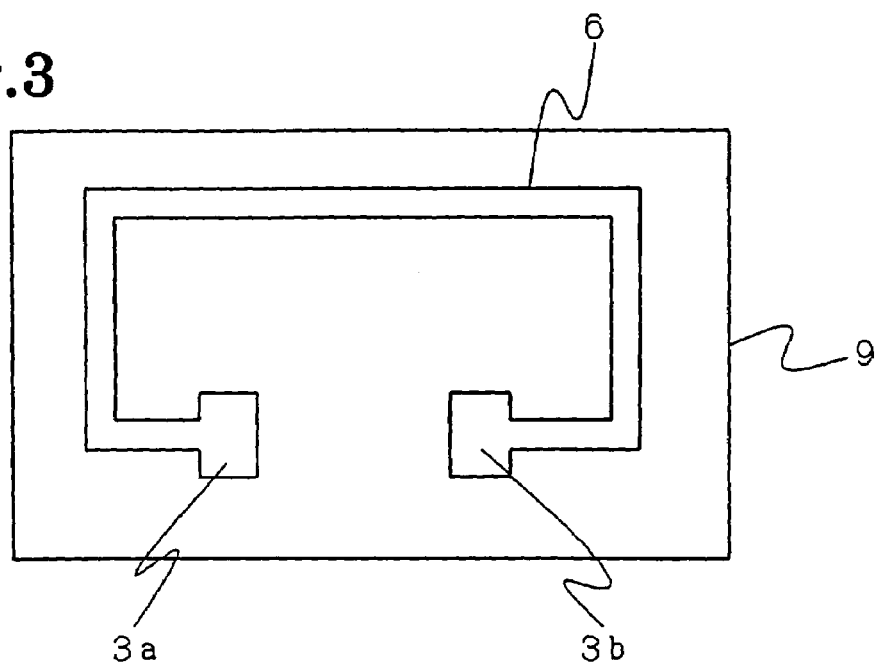
[FIG. 3] A plan view of an antenna circuit board.
Figure 4:
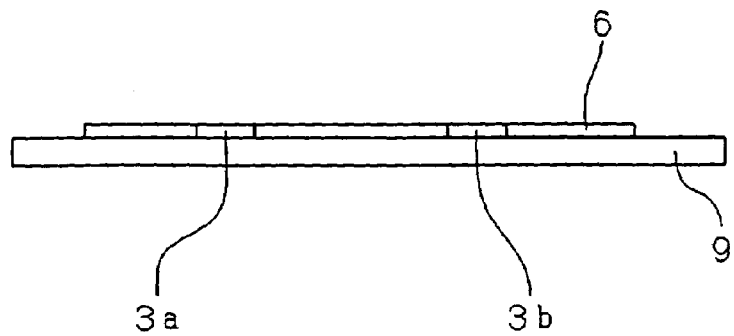
[FIG. 4] A front elevational view of FIG. 3.

In both drawings, an interposer board 7 is laminated on an antenna circuit board 2 on the lower side. As shown in a plan view of FIG. 3 and in FIG. 4 that is a front elevational view of FIG. 3, the antenna circuit board 2 has a structure in which an antenna 6 and electrodes 3a and 3b (referred to as antenna electrodes hereinafter) connected thereto are formed on a rectangular substrate 9 composed of a resin film which is an insulating material.

The antenna 6 and the antenna electrodes 3a and 3b are formed by printing a conductive adhesive, a mixture of conductive particulates and resin binder, on a resin film and then drying or curing it. That is, as shown in the drawings, the antenna electrodes 3a and 3b are single layer resin electrodes.

Furthermore, it is possible to form the antenna 6 and the antenna electrodes 3a and 3b described above by etching an aluminum foil or a copper foil that is stuck to a resin film. The electrodes in this case are metal electrodes.

Figure 5:
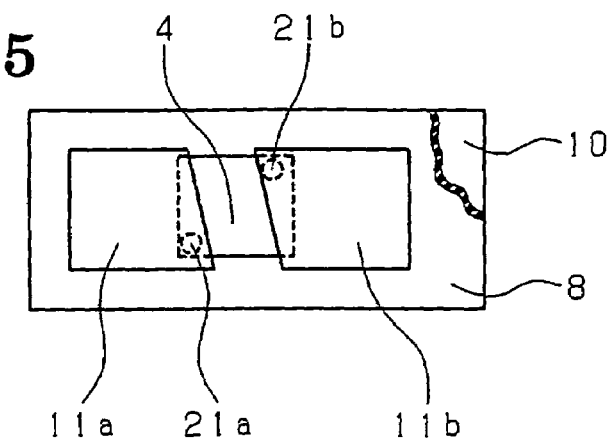
[FIG. 5] A plan view of an interposer board.
Figure 6:
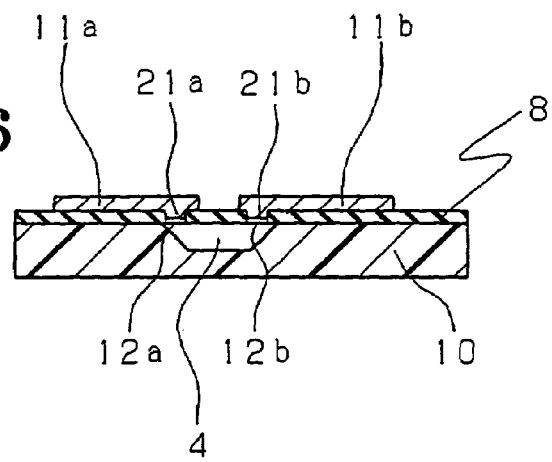
[FIG. 6] A longitudinal sectional view of FIG. 5.

Meanwhile, as shown in a plan view of FIG. 5 and in FIG. 6 that is a longitudinal sectional view of FIG. 5, the interposer board 7 has a structure in which an IC chip 4 is embedded in a rectangular substrate 10 composed of a resin film of an insulating material. That is, the IC chip 4 is embedded in the substrate 10 in such a manner that the circuit face of the IC chip 4 and the top face of the substrate 10 form the same plain face, and enlarged electrodes 11a and 11b connected to electrodes 12a and 12b of the IC chip 4 are also formed.

The enlarged electrodes 11a and 11b are formed on an insulating resin layer 8 formed on the substrate 10. Via connecting terminals 21a and 21b thereof (for example, the ones formed by filling and curing the conductive adhesive which is a mixture of conductive particulates and resin binder in a via-hole that goes through the insulating resin layer), the enlarged electrodes 11a and 11b are connected to the electrodes 12a and 12b of the IC chip 4.

The enlarged electrodes 11a and 11b and the connecting terminal 21a and 21b are formed by forming the via-hole in the insulating resin layer, printing and filling the conductive adhesive that is a mixture of the conductive particulates and the resin binder in the via-hole, and then drying or curing it.

Like the above-mentioned antenna electrodes 3a and 3b, the enlarged electrodes 11a and 11b are also single layer resin electrodes formed by using the conductive adhesive that is a mixture of the conductive particulates and the resin binder.

Figure 1:
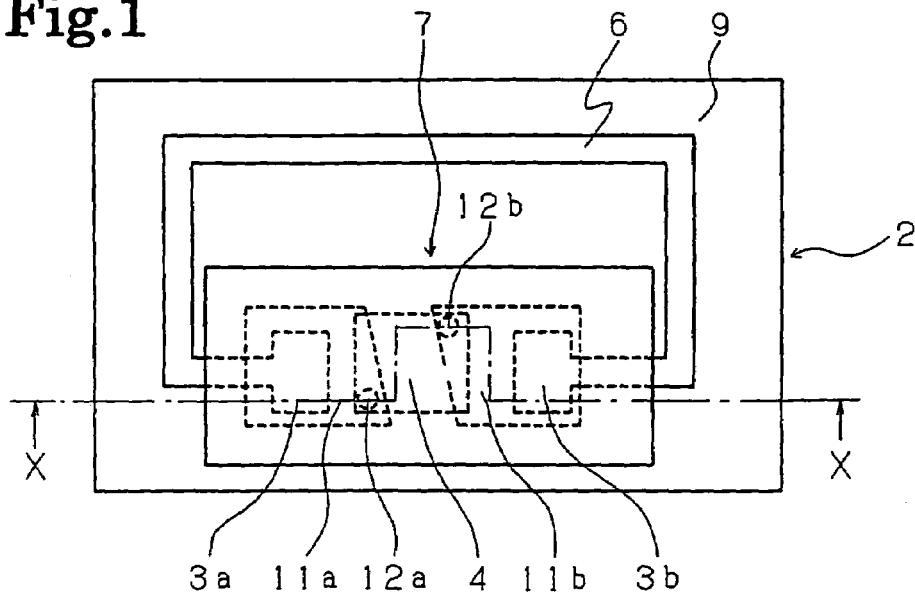
[FIG. 1] A plan view of a non-contact ID card.
Figure 2:
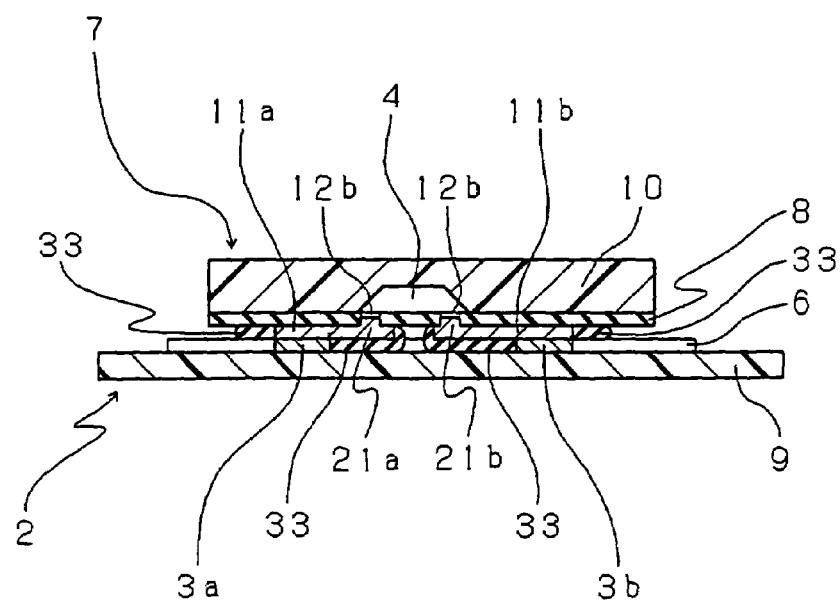
[FIG. 2] A perspective cross section taken along the line X-X of FIG. 1.
Figure 7:
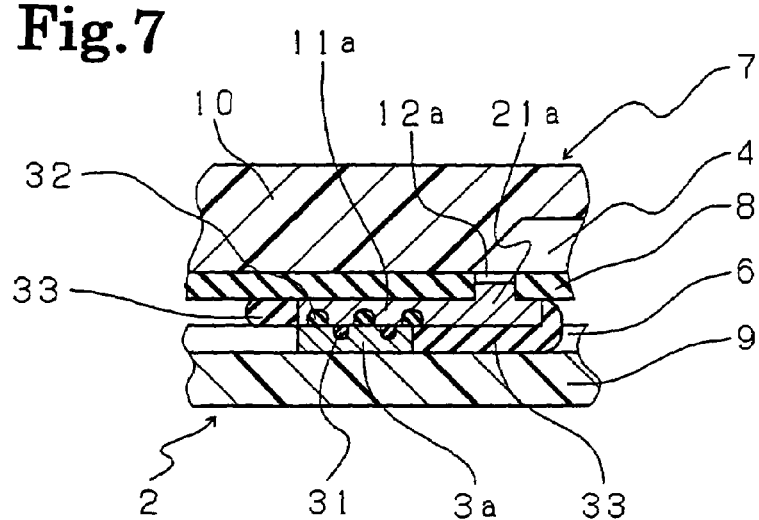
[FIG. 7] An enlarged view of an electrode bonding area of FIG. 2.

As shown in FIG. 1 and FIG. 2, both antenna electrodes 3a and 3b and the enlarged electrodes 11a and 11b are formed in a flat shape. As for the flat electrodes, it is possible to perform bonding as in such a manner of laminating web materials at the time of adhesively bonding both electrodes; thus, high-speed bonding can easily be achieved. Furthermore, the above-mentioned antenna electrodes 3a and 3b and the enlarged electrodes 11a and 11b are partially adhesively bonded in such a manner that each of the bonding faces is closely contacted to each other. FIG. 7 shows an enlarged view of the bonded state of the antenna electrode 3a and the enlarged electrode 11a. Bonding of the antenna electrode 3b and the enlarged electrode 11b that is not shown in the drawing is also the same.

The antenna circuit board 2 and the interposer board 7 are both substantially the flat substrates in a film form or a sheet form. Thus, the adhesive-bonding of the antenna circuit board 2 and the interposer board 7 can be performed as if web materials such as a film-form material and a sheet form material are laminated and pasted. Therefore, the adhesive-bonding can be effectively performed.

As shown in the drawing, the antenna electrode 3a and the enlarged electrode 11a are adhesively bonded by an insulating adhesive 33 that is filled in minute recesses 31 and 32, which are formed on each bonding face. The recesses 31 and 32 are naturally formed along the formation of the electrodes, not formed artificially by performing rough-face processing or the like on the bonding faces of the antenna electrode 3a and the enlarged electrode 11a. Thus, those are dispersedly present on the bonding faces. In FIG. 7, the recesses 31 and 32 are illustrated larger than the actual ones for better understanding.

In a flip chip bonding of a semiconductor chip, so-called an NCP bonding method is well known, in which insulating resin is applied to the electrode of the substrate, the bump of the semiconductor chip is abutted against the substrate electrode and pressurized and heated, and the bonding is performed by using the shrinkage stress caused when the insulating resin is cured for bonding an electrode projection (bump) formed on an electrode of the semiconductor chip to an electrode of a circuit board. However, the NCP bonding method uses the bumps which are regularly arranged through complicated bump-forming steps such as photolithography and a lift-off method, whereas the electrodes of the present invention are naturally formed by printing the conductive adhesive which is a mixture of the conductive particulates and the resin binder and drying or curing it. Therefore, the electrode bumps (the minute convex portions in the present invention) for bonding can be formed easily at a low cost.

When the insulating adhesive 33 is used for bonding the above-mentioned antenna electrodes 3a and 3b and the enlarged electrodes 11a and 11b, it is possible that both electrodes conduct electricity by closely contacting the portions (a part of the bonding faces) on which the recesses 31 and 32 are not formed and also possible to securely adhesively bond both electrodes by using a small amount of insulating adhesive 33 filled in the recesses 31 and 32. The size of the recesses 31 and 32 is between 0.1 µm and 100 µm, preferably between 0.5 µm and 50 µm, and more preferably between 5 and 50 µm.

The minute recesses 31 and 32 mentioned above are not limited to be formed only on the resin electrodes but also formed on the metal electrodes. Thus, the antenna electrodes 3a and 3b and the enlarged electrodes 11a and 11b may be any electrodes selected from the metal electrodes, the resin electrodes, and the electrodes obtained by laminating the metal electrode and the resin electrode.

However, it is preferable that at least either one to be the resin electrode since larger recesses 31 and 32 are likely to be formed on the above-mentioned resin electrode than on the metal electrode. For the metal electrode, the use of a copper foil obtained by performing rough-face processing on a raw material copper foil enables to form large recesses.

Examples of the above-mentioned conductive particulates are silver particles, particles obtained by performing silver-plating on copper particles, a mixture obtained by mixing carbon and silver particles, and so forth. Resin binder may be either thermoplastic or thermoset. The thermoplastic characteristic or the thermosetting characteristic is determined in accordance with the selection of the binder.

The resin binder obtained by mixing the thermoplastic resin and the thermosetting resin may also be used. Examples of the thermoplastic resin are polyester-based resin, acryl-based resin, and so forth, and examples of the thermosetting resin are epoxy-based resin, polyimide-based resin, and so forth.

The conductive adhesive of the above-mentioned composition is in a paste form, which is applied (for example, dropped, printed or the like) for forming the antenna electrodes 3a and 3b, or the enlarged electrodes 11a and 11b, or both electrodes for the resin electrodes. The thermoplastic conductive adhesive is more preferable than the thermosetting conductive adhesive since it enables to shorten the processing time after applied.

It is also preferable to use a conductive adhesive obtained by mixing conductive particulates with the thermoplastic resin binder, with the resin binder obtained by mixing the thermoplastic resin and the thermosetting resin, or with other resin binder which, like the thermoplastic resin binder, exhibits the bonding property or the adhesion property when heated.

In the case where the thermoplastic conductive adhesive is diluted in solvent to be printed, e.g. screen-printed, for forming the enlarged electrodes 11a and 11b, the antenna electrodes 3a and 3b, or both electrodes, the electrodes are dried after the printing, and are subsequently bonded. It is the same in the case of using the thermosetting conductive adhesive. The thermosetting conductive adhesive exhibits a strong bonding strength; however, the processing time (thermosetting time) after the printing is relatively long (generally, several seconds or more). Thus, both may be used selectively in accordance with the reliability of the electrical properties and the like required in the non-contact ID card.

Adhesive-bonding of both electrodes are performed by laminating the antenna circuit board 2 and the interposer board 7 in the state where the positions of the antenna electrodes 3a and 3b and the enlarged electrodes 11a and 11b are aligned. Before that, the insulating adhesive 33 is applied to either one of the antenna electrodes 3a and 3b or the enlarged electrodes 11a and 11b, or on both, so as to fill insulating adhesive into the minute recesses dispersed on the electrode bonding faces. Then, after the lamination, both electrodes are pressurized to be closely contacted to each other thereby bonding both electrodes together by the insulating adhesive 33 filled in the minute recesses 31 and 32.

Another adhesive-bonding of both electrodes is performed by laminating the antenna circuit board 2 and the interposer board 7 in the state where the positions of the antenna electrodes 3a and 3b and the enlarged electrodes 11a and 11b are aligned. Before that, the insulating adhesive 33 is applied to either one of the antenna electrodes 3a and 3b or the enlarged electrodes 1a and 11b, or on both. Then, after the lamination, both electrodes are pressurized and heated to be closely contacted to each other for filling the insulating adhesive 33 into the minute recesses 31 and 32 dispersed on the respective bonding faces of both electrodes and squeezing out the remainder of the insulating adhesive 33 from the closely contacted portion to the electrode side periphery. Thereby, both electrodes are bonded together by the insulating adhesive 33 filled in the minute recesses 31 and 32.

It is possible to completely fill the minute recesses with the insulating adhesive 33 by pressurizing and heating. By applying the insulating adhesive 33 on the electrodes and filling it into the minute recesses before the bonding in lamination, both electrodes can be bonded together only by the above-described pressurization. Thus, a heating device becomes unnecessary and the apparatus is simplified. Moreover, it is possible to achieve high-speed lamination-bonding thereby enabling to improve the productivity.

Furthermore, in order to increase the reliability of the bonding while protecting the electrodes, the insulating adhesive 33 with a sealing function (for example, a waterproof property or the like) can be used. In that case, for bonding both electrodes together, when the insulating adhesive 33 is squeezed out to the electrode side periphery by pressurizing and heating for setting it around the electrodes, the electrode areas can be sealed. Thereby, the reliability of the electrical bonding in the bonding areas can be increased.

The insulating adhesive 33 is not limited only to those with the bonding characteristic in addition to the insulating characteristic. It also includes so-called insulating pressure-sensitive adhesive with the pressure-sensitive adhesion characteristic in addition to the insulating characteristic. Preferred is the one that still keeps the adhesiveness even when cooled. Typical examples are hot-melt adhesives of EVA base, polyolefin base, synthetic rubber base, adhesive polymer base, urethane base reactive base, and so forth. The hot-melt adhesive has a characteristic that it easily spreads to form a thin layer when heated and pressurized.

Among those, the synthetic rubber hot-melt adhesive is most preferable since it has a characteristic of easily spreading to form a thinner layer even by a low pressurizing force. Application of the insulating adhesive 33 for either one of the antenna electrodes 3a and 3b or the enlarged electrodes 11a and 11b may be performed by a conventionally known method, such as dropping by a nozzle and transferring by a pin or a roller.

When applying the insulating adhesive 33 on the electrodes in advance, it is possible to fill it sufficiently into the depths of the minute recesses by applying it by a method of dropping, transferring, or the like after heating it so that it easily flows. Thus, if the insulating adhesive 33 is heated and applied to the minute recesses in advance, it is possible to bond both electrodes only by pressurizing as in the above-described case.

Figure 10:
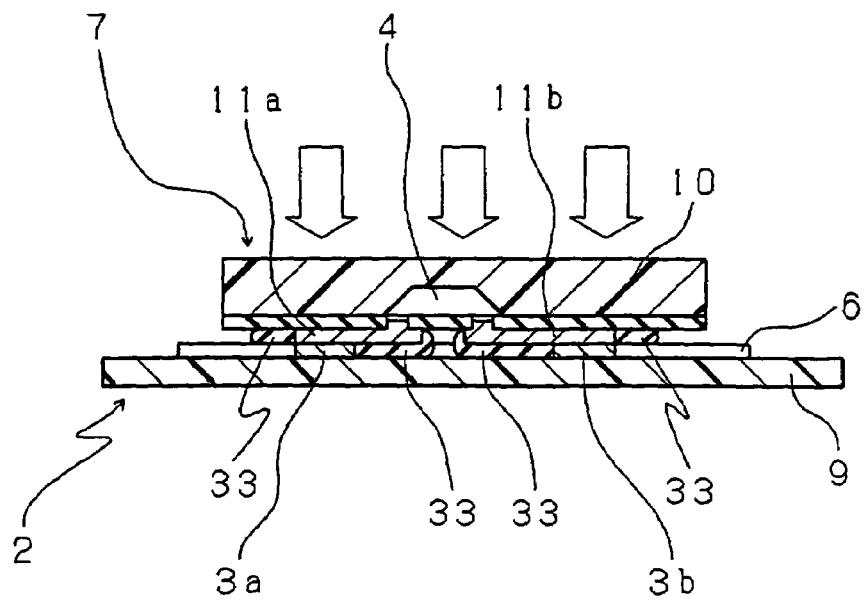
[FIG. 10] A longitudinal sectional view for showing the state where the electrode (antenna electrode) of the antenna circuit board and the enlarged electrode of the interposer board of FIG. 6 are bonded.

The above-described adhesive-bonding will be described more specifically by referring to FIG. 8 to FIG. 10. FIG. 8 illustrates the state in which the antenna circuit board 2 on the lower side and the interposer board 7 on the upper side are laminated, and the insulating adhesive 33 is applied to the antenna electrodes 3a and 3b on the lower side. In the meantime, positions of the enlarged electrodes 11a and 11b on the upper side are aligned to be appropriate for bonding with the antenna electrodes 3a and 3b.

FIG. 9 illustrates the laminated state in which the interposer board 7 is brought down and the enlarged electrodes 11a and 11b are in contact with the insulating adhesive 33 on the antenna electrodes 3a and 3b. Furthermore, FIG. 10 illustrates the state in which both electrodes are closely contacted to each other by heating and pressurizing the interposer board 7 against the antenna circuit board 2. In other words, the enlarged electrodes 11a and 11b and the antenna electrodes 3a and 3b are closely contacted to each other.

This heating and pressurization is performed by using a heat tool, which is not shown. By pressurizing and heating to closely contact both electrodes to each other, the insulating adhesive 33 can be filled in the minute recesses 31 and 32 (see FIG. 7) dispersed on the respective bonding faces of both electrodes, as described above. Moreover, the remainder of the insulating adhesive 33 can be squeezed out from the closely contacted portion to the electrode side periphery so that both electrodes can be adhesively bonded together by the insulating adhesive 33 filled in the minute recesses 31 and 32. When the above-mentioned hot-melt adhesive is selected as the insulating adhesive 33, it is possible to lamination-bond both boards in an extremely short time of about 0.05 to 0.2 seconds.

Figure 11:
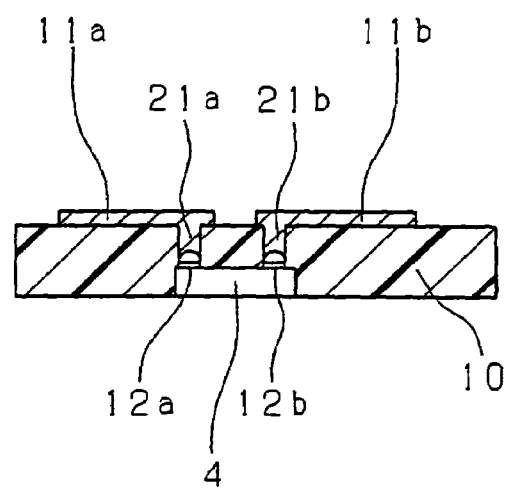
[FIG. 11] A longitudinal sectional view for showing another example of the interposer board.

In the present invention, the interposer board 7 may be the one in FIG. 11 instead of the one in FIG. 6 described above. The IC chip 4 is embedded in the substrate 10 in these figures; however, it may be mounted without embedding the IC chip 4. However, it is preferable to embed the IC chip 4 in the substrate 10 for achieving a thinner board.

By using the web-type interposer board in which the IC chip 4 is embedded in the resin film, and the web-type antenna circuit board formed also by the resin film and the like, it is possible to bond both electrodes in lamination by a roll-to-roll method in the manner for commonly handling the web-type substance, and to manufacture the non-contact ID card.

Furthermore, as described above, at least either one of the antenna electrodes 3a and 3b or the enlarged electrodes 11a and 11b may be formed to be the laminated electrode comprising layers of the resin electrodes formed by using a plurality of conductive adhesives of various compositions, instead of being formed to be the single layer electrode comprising the resin electrode. For example, it may be the laminated electrode obtained by forming the upper layer electrode formed by using the thermoplastic conductive adhesive on the lower layer electrode formed by using a thermosetting conductive adhesive.

Figure 12:
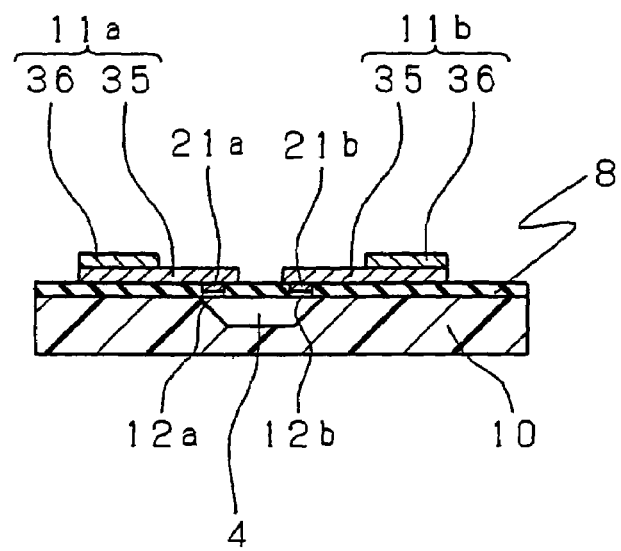
[FIG. 12] A longitudinal sectional view for showing another example of the interposer board.
Figure 13:
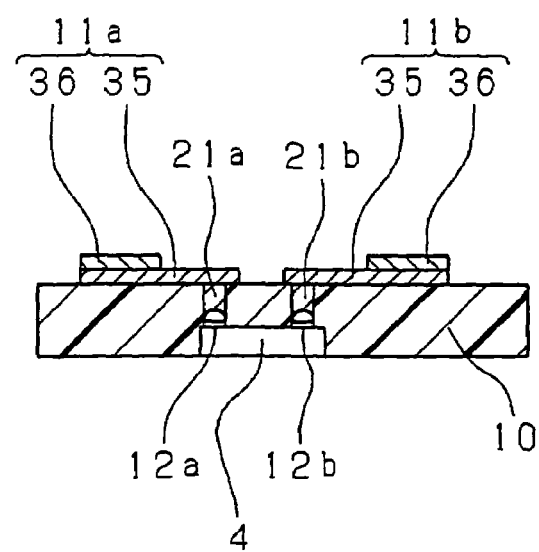
[FIG. 13] A longitudinal sectional view for showing another example of the interposer board.

Furthermore, as shown in FIG. 12 and FIG. 13, the enlarged electrodes 11a and 11b may be formed of the laminated electrodes and comprise layers of a metal electrode 35 formed on the substrate 10 and a resin electrode 36 that is formed on the metal electrode 35 by using a conductive adhesive. The interposer board 7 in FIG. 12 comprises an insulating resin layer 8, but the interposer board 7 in FIG. 13 does not.

Figure 14:
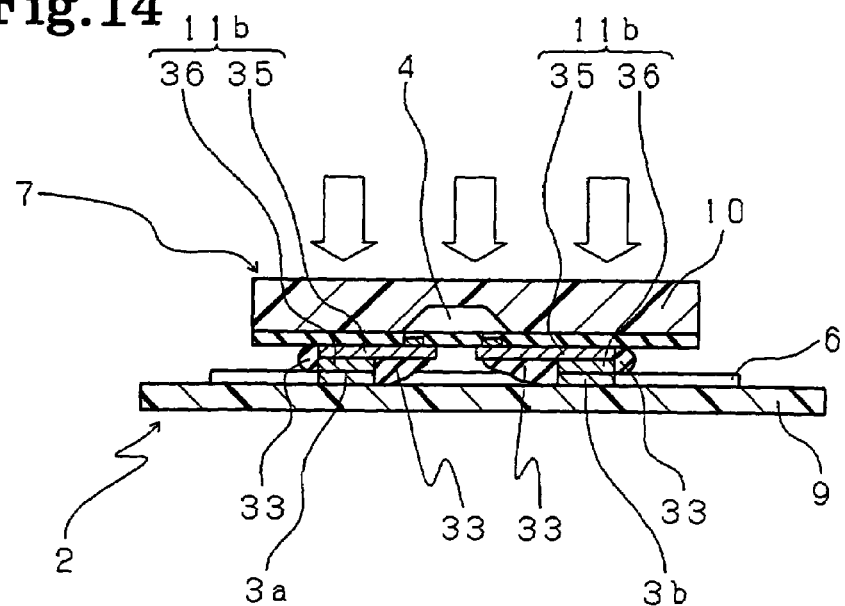
[FIG. 14] A longitudinal sectional view for showing the state where the electrode (antenna electrode) of the antenna circuit board and the enlarged electrode of the interposer board of FIG. 12 are bonded.
Figure 15:
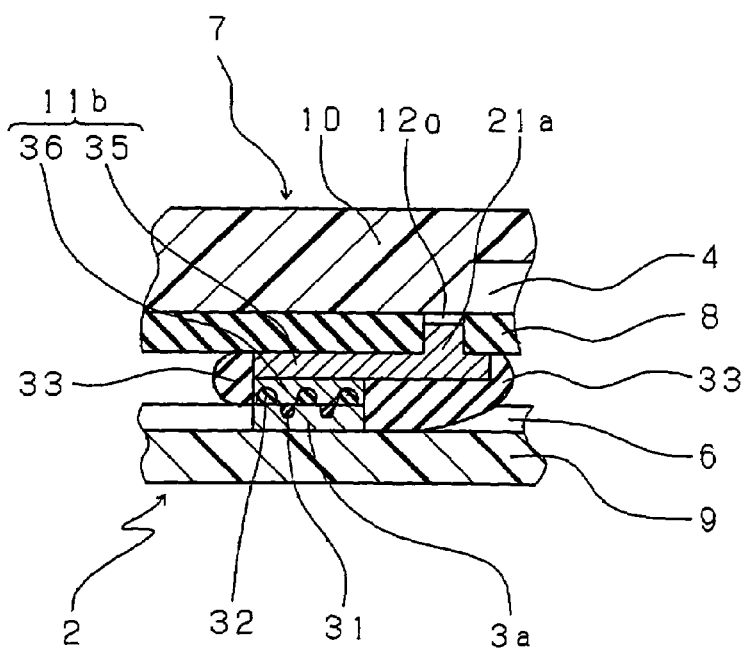
[FIG. 15] An enlarged view of the electrode bonding area of FIG. 14.

As shown in FIG. 14, the interposer board 7 and the antenna circuit board 2 shown in FIG. 12 can be bonded. In this case, the antenna electrodes 3a and 3b and the enlarged electrodes 11a and 11b are also adhesively bonded in the state in which the respective bonding faces are closely contacted to each other. FIG. 15 illustrates the enlarged view of the bonded state of one of the antenna electrode 3a and the enlarged electrode 11a. The bonding of the other antenna electrode 3b and the enlarged electrode 11b, which is not shown, is also the same.

As shown in the drawing, the antenna electrode 3a and the enlarged electrode 11a are adhesively bonded by the insulating adhesive 33 filled in the minute recesses 31 and 32, which are formed on the respective bonding faces. The bonding face of the enlarged electrode 11a is formed by using the above-mentioned resin electrode 36, and the insulating adhesive 33 is filled in the minute recess 32 dispersed thereon. In FIG. 15, the recesses 31 and 32 are illustrated larger than the actual size for better understanding.

Thus, by the insulating adhesive 33, it is possible that both electrodes conduct electricity by closely contacting the portions (a part of the bonding faces) to each other where the recesses 31 and 32 are not formed. It is also possible to securely adhesively bond both electrodes by the insulating adhesive 33 filled in the recesses 31 and 32.

Figure 16:
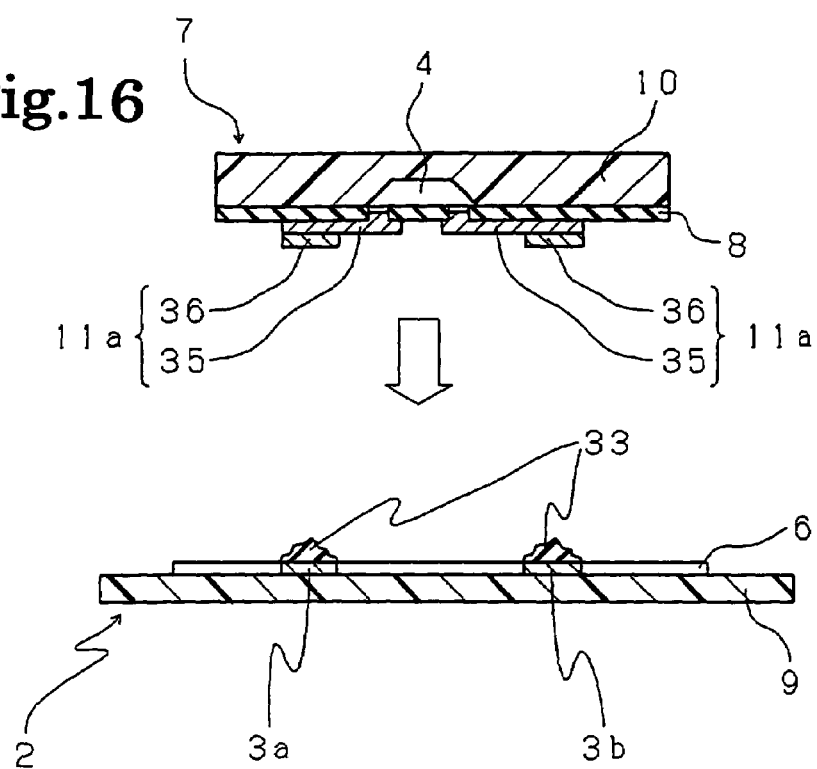
[FIG. 16] A longitudinal sectional view for showing the positional relation between the antenna circuit board and the interposer board of FIG. 12 at the time of starting the bonding.
Figure 17:
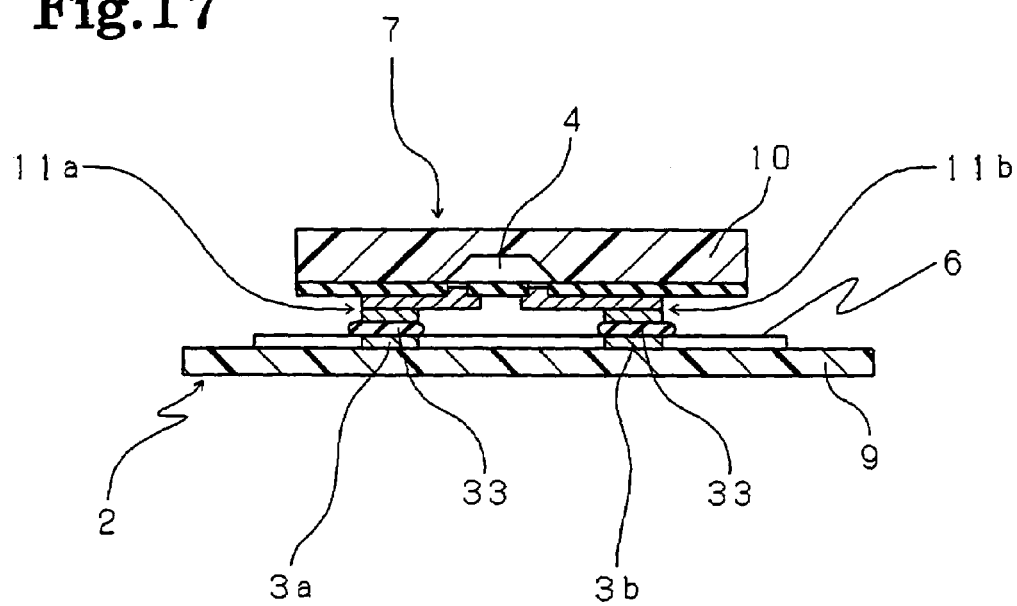
[FIG. 17] A longitudinal sectional view for showing the state where the enlarged electrode of the interposer board of FIG. 12 is brought in contact with an insulating adhesive applied to the electrode (antenna electrode) of the antenna circuit board.

For this bonding, as shown in FIG. 16, the insulating adhesive 33 is applied to the antenna electrodes 3a and 3b on the lower side. In the meantime, the positions of the enlarged electrodes 11a and 11b on the upper side are aligned to be appropriate for being bonded to the antenna electrodes 3a and 3b. Then, as shown in FIG. 17, the interposer board 7 is brought down to be laminated in the state in which the enlarged electrodes 11a and 11b are in contact with the insulating adhesive 33 on the antenna electrodes 3a and 3b. Then, the interposer board 7 is heated and pressurized against the antenna circuit board 2 to closely contact both electrodes to each other. Therefore, as described above, both electrodes can be securely adhesive-bonded.

FIG. 16 illustrates the case in which the insulating adhesive 33 is applied to the antenna electrodes 3a and 3b. However, before the bonding, if the insulating adhesive 33 is applied in advance to the enlarged electrodes 11a and 11b, and is filled in the minute recesses, it is possible to align the positions of the enlarged electrodes with respect to the antenna electrodes and to perform the bonding with electrical conductivity by pressurization.

Instead of forming the enlarged electrodes 11a and 11b by the laminated electrode comprising layers of the metal electrode 35 formed on the substrate 10 and the resin electrode 36 formed on the metal electrode 35 by using the conductive adhesive, it is possible to form only the antenna electrodes 3a and 3b, or both enlarged electrodes 11a and 11b and the antenna electrodes 3a and 3b, as the laminated electrode that is constituted of the metal electrode 35 and the resin electrode 36. In short, at least either of the antenna electrodes 3a and 3b or the enlarged electrodes 11a and 11b may be formed to be such laminated electrode.

When the enlarged electrodes 11a and 11b were formed with the metal electrode 35 and the resin electrode 36 that was formed by using the thermoplastic conductive adhesive so as to be bonded to the antenna electrodes 3a and 3b of the metal electrode, the bonding was achieved in 0.05 to 0.2 seconds. The electric resistance value in the bonding area at that time was $0.1\Omega$ to $1\Omega$, and the bonding strength was 10 N/cm to 50 N/cm.

In the case of using the conductive adhesive obtained by mixing the conductive particulates with the resin binder of a mixture of the thermoplastic resin and the thermosetting resin, or with other resin binder which, like the thermoplastic resin binder, exhibits the bonding property or the adhesion property when heated, the bonding time and the electric resistance value were almost the same. A rotary-type composed of a pressure roller comprised of a heat source is preferable as a heat tool to be used as a means for heating and pressurizing at the time of bonding. Particularly, it is preferable to arrange a plurality of rotary-type heat tools in series for heating and pressurizing the laminated body of the antenna circuit board and the interposer board by these heat tools. This is because high-speed bonding can be achieved by shortening the bonding time.

It is preferable that the insulating adhesive used for adhesive-bonding is expanded thin to be spread at a low temperature by a small pressurizing force and also in a short time. Therefore, the relation between the tensile strength and the elongation of the insulating adhesive is important. The tensile strength is 3 MPa or less, and preferable to be 1 MPa or less. The elongation is 300% or more, and preferable to be 500% or more.

EXAMPLE

Antenna resin electrode were formed on a polyester film by a printing method using thermoplastic silver paste FA-333, a product of Fujikura Ltd. The antenna resin electrode is 2.0 mm×2.0 mm in size and 12 μm in thickness. Meanwhile, enlarged resin electrode were formed by the same printing method using thermoplastic silver paste PES-E91, a product of TOAGOSEI CO., LTD. The enlarged resin electrode is 2.5 mm×2.5 mm in size and 30 μm in thickness.

For adhesively bonding the enlarged resin electrodes and the antenna resin electrodes, a synthetic rubber hot-melt agent PPET, a product of TOAGOSEI CO., LTD, was applied to the antenna electrode by 0.5 mg per electrode using a transfer pin. Then, the interposer board was adsorbed by a vacuum suction port of a pressurizing tool for aligning the positions of the antenna resin electrodes and the enlarged electrodes. Subsequently, the pressurizing tool was brought down for pressurizing and heating both electrodes to achieve adhesive-bonding.

The heating temperature at that time was at 180° C., the pressurizing force was 0.8 MPa, and the adhesive-bonding time was 0.2 seconds. The bonding resistance at that time was 0.3 to 0.4 $\Omega$. The increase of the resistance value was within the permissible range even after going through a high-temperature/high-humidity test at 60° C. and 93% RH and a temperature cycle test run between −40° C. and 80° C.

The PPET used for the adhesive-bonding was an insulating adhesive having an extremely stretchable characteristic with the tensile strength of 0.3 MPa and the elongation of 1400%.

What is claimed is:

1. A non-contact ID card, comprising an antenna circuit board having an antenna formed on a substrate, and an interposer board having an enlarged electrode, which is connected to an electrode of an IC chip, formed on a substrate on which the IC chip is mounted; the non-contact ID card being formed by laminating both boards in such a manner that an electrode of the antenna and the enlarged electrode are bonded, wherein both electrodes are adhesively bonded by an insulating adhesive filled in minute recesses dispersed on bonding faces of the electrode of the antenna and/or the enlarged electrode.

2. The non-contact ID card as claimed in claim 1, wherein at least either of the electrode of the antenna and the enlarged electrode is a single layer electrode comprising a resin electrode which is formed by using a conductive adhesive.

3. The non-contact ID card as claimed in claim 2, wherein the conductive adhesive is thermoplastic.

4. The non-contact ID card as claimed in claim 2, wherein the conductive adhesive is thermoset.

5. The non-contact ID card as claimed in claim 1, wherein at least either of the electrode of the antenna and the enlarged electrode is a laminated electrode comprising layers of resin electrodes which are formed by using a plurality of conductive adhesives of various compositions.

6. The non-contact ID card as claimed in claim 1, wherein at least either of the electrode of the antenna and the enlarged electrode is a laminated electrode comprising layers of a metal electrode that is formed on the substrate and a resin electrode that is formed by using a conductive adhesive on the metal electrode.

7. The non-contact ID card as claimed in claim 1, wherein the IC chip is embedded in the substrate.

* * * * *